United States Patent [19]

Rapaport

[11] Patent Number: 5,701,081
[45] Date of Patent: Dec. 23, 1997

[54] INSTRUMENT USED FOR THE LIVE TROUBLESHOOTING OF SHORT CIRCUITS

[76] Inventor: Leon St Aubyn Rapaport, 7503 Forrest Ave., Philadelphia, Pa. 19150

[21] Appl. No.: 588,050

[22] Filed: Jan. 22, 1996

[51] Int. Cl.$^6$ ............................................. G01R 31/02
[52] U.S. Cl. ..................... 324/555; 324/511; 324/537; 340/650
[58] Field of Search ................... 324/500, 511, 324/537, 555, 556; 340/650; 361/58, 93, 115

[56] References Cited

U.S. PATENT DOCUMENTS

| | | | |
|---|---|---|---|
| 3,259,841 | 7/1966 | Proctor et al. | 324/555 |
| 4,039,937 | 8/1977 | Laass | 324/555 |
| 4,362,987 | 12/1982 | Clinton | 324/525 |
| 4,580,091 | 4/1986 | Robinson et al. | 324/555 |
| 4,791,376 | 12/1988 | Freedman et al. | 324/555 |
| 4,799,019 | 1/1989 | Cooley et al. | 324/555 |
| 4,878,025 | 10/1989 | Persson | 324/500 X |
| 5,193,108 | 3/1993 | Stocklin | 324/555 |
| 5,359,291 | 10/1994 | Dommerich, III | 324/537 |
| 5,473,253 | 12/1995 | Araki | 324/555 |
| 5,477,133 | 12/1995 | Earle | 324/555 |
| 5,488,307 | 1/1996 | Plott | 324/555 |
| 5,587,661 | 12/1996 | Schneider et al. | 324/556 |

Primary Examiner—Glenn W. Brown

[57] ABSTRACT

An instrument used for the live troubleshooting of short circuits in electronic equipment. This instrument has a current indicator, an adjustment to set the maximum current and electrical connectors. The short circuited line on the equipment to be repaired is opened and the connectors are connected, in order to complete the circuit. The instrument is adjusted to deliver a maximum current which is safe for the equipment when the equipment is functioning normally. The technician will now be able to troubleshoot the live circuit without causing further damage.

1 Claim, 3 Drawing Sheets

INSTRUMENT USED FOR THE LIVE TROUBLESHOOTING OF SHORT CIRCUITS

BACKGROUND OF THE INVENTION

1. Field of the Invention

The present invention relates in general to the detecting of short circuits in faulty electronic equipment and more specifically to television horizontal deflection circuits and switching power supplies.

2. Prior Art

Technicians have the following problem when repairing electronic circuits, especially television horizontal deflection circuits and switching power supplies. The technician finds a number of components blown. After replacing these defective components, suddenly the same components blow again. This occurred because the root cause of the original failure was not discovered.

Television horizontal deflection circuits are the source of many different voltages that run a modern television. These voltages are derived from the pulses in the various secondary windings of the flyback transformer. They are rectified and filtered to produce stable voltages to run the various circuits in the television.

The switching power supply also is the source of many different voltages. These voltages are derived from the pulses in the various secondary windings of the switching transformer. They are also rectified and filtered to produce stable voltages to run the various circuits in the equipment.

A short circuit can occur in any of these circuits or in the transformer windings. Sometimes these shorts are intermittent and they only occur when full power is applied to the unit being repaired ( henceforth referred to as unit or the unit) and after the unit has been working for a time. Because of the nature of this problem, the technician cannot detect the faulty component by resistance measurement.

The only way of finding the defective component is to apply power to the unit and make live voltage measurements. This is when the same destruction occurs again.

As there is no instrument available to do this, technicians resort to three methods to alleviate this problem:

1. The light bulb method.
2. The variac method.
3. The trip circuit method.

The light bulb

The light bulb is placed in series with the unit. The resistance of the light bulb will limit the current, giving some protection to the unit.

Disadvantages

1. This is a passive device, in that it cannot alter its resistance automatically to give less current when necessary. Because of this, even with no shorts, it introduces a large voltage drop into the circuit. This stresses the switching power supply because it tries to compensate for this low voltage by conducting longer. When the short occurs, more current will flow, thereby damaging the unit.

2. If the resistance of the bulb is too high the unit will fail to operate properly, some will not even turn on. The technician cannot actively troubleshoot the unit if it is not operating, i.e., the technician needs to measure voltages on a live circuit.

3. The technician cannot adjust the value of the light bulb's resistance. The technician would therefore need a number of light bulbs of different resistances to get the protection needed for different units, which draw differing amounts of current.

4. The light bulb's resistance changes with temperature. After the light bulb gets hot then its resistance increases. Too much resistance prevents the unit from operating, giving a false impression of problems and confuses the technician.

The variac

The unit is plugged into the variac. The variac is adjusted to lower the A.C. (Alternating Current) voltage to the unit. By operating the unit at a lower voltage the current will be less, giving some protection.

Disadvantages

1. This is also a passive device, in that it cannot alter its voltage automatically to give less current in the event of a short circuit. Because of this, tremendous current can flow, thereby damaging the unit.

2. By lowering the voltage by too much most units will fail to operate properly, some will not even turn on. The technician cannot actively troubleshoot the unit if it is not operating, i.e., the technician needs to measure voltages on a live circuit.

3. The variac cannot be inserted in the D.C. (Direct Current) line, where one would get the best protection.

4. The variac is heavy and cumbersome to take on service calls.

With both the variac and light bulb the technician is forced to compromise. If the variac is set too low to get better protection, the unit may not start, if it is set high enough to start, the unit may blow. The same is true with the light bulb if the resistance is too high to give better protection, the unit may not start, if it is too low the unit may blow.

The trip circuit

The trip circuit is like an automatic fuse.

Disadvantages

1. Semiconductors blow in less than 20 milliseconds. Sometimes the trip circuit does not respond fast enough.

2. If it does trip fast enough, then the unit is now inoperative. The technician cannot actively troubleshoot the unit if it is not operating, i.e., the technician needs to measure voltages on a live circuit. This makes the trip circuit the most ineffective method of all.

SUMMARY OF THE INVENTION

The instrument is placed in series with the unit. The current is set to the value normally drawn by the unit. It actively controls its conduction to limit the current, giving better protection to the unit.

Advantages

1. This is an ACTIVE instrument as opposed to the passive methods in the prior art. This instrument offers very little voltage drop when there is no short circuit, typically less than 5%. The variac and light bulb need to introduce 30% to 40% voltage drop to give some protection. This instrument will allow the unit to get nearly full voltage for normal operation. When a short circuit occurs, this instrument will sense the condition and limit the current to the value to which it was set. This eliminates the problem of the unit failing to start because of low voltage. This also gives superior protection by limiting the current to the value that was set. The technician will then have a live unit to troubleshoot.

2. This instrument has an adjustment to set the desired current to a safe value.

3. This instrument is especially useful when repairing switching power supplies. With switching power supplies, if the error circuit is defective, excessive voltages will be produced thereby destroying the power supply and the unit it is meant to run. By setting this instrument to the current required for normal operation this condition will not occur.

4. This instrument can be used in the A.C. line of the unit for ease of connection (across the fuse connector). This gives good protection. The best protection is achieved when the instrument is placed in the D.C. line, between the filter capacitor and the load. This way it prevents the energy stored in the filter capacitor from blowing the unit, when a short circuit occurs.

5. This instrument is light, portable and can easily be taken on service calls.

6. This instrument can be inserted in any shorted line to troubleshoot that line safely.

OBJECTS OF THE INVENTION

It is a principal object of the present invention to provide the technician with an instrument to perform live troubleshooting of short circuits safely. It is another object of the present invention to provide an instrument to safely exercise an intermittent circuit so that the faulty component may fail permanently making the problem easier to diagnose.

The knob, coupled to the potentiometer 17, points to a dial on the front panel. By rotating the knob the potentiometer is set to the desired current.

When troubleshooting short circuits, and it is evident that the short persists, technicians would try to remove power from the unit being repaired as quickly as possibly. No human can react fast enough and often it is too late. The present invention gives the technician time to measure voltages safely and calmly remove power from the unit. The present invention changes the required time to respond from milliseconds to a time in which the average human can calmly respond.

A fast enough trip circuit may protect the unit, but would not provide the opportunity to measure voltages or exercise the unit. Each time the trip circuit trips, the technician would be no wiser as to the cause of the problem. This is why the present invention is needed to keep the unit on the brink of failure so that the technician can measure voltages and determine the problem.

Figure 2:
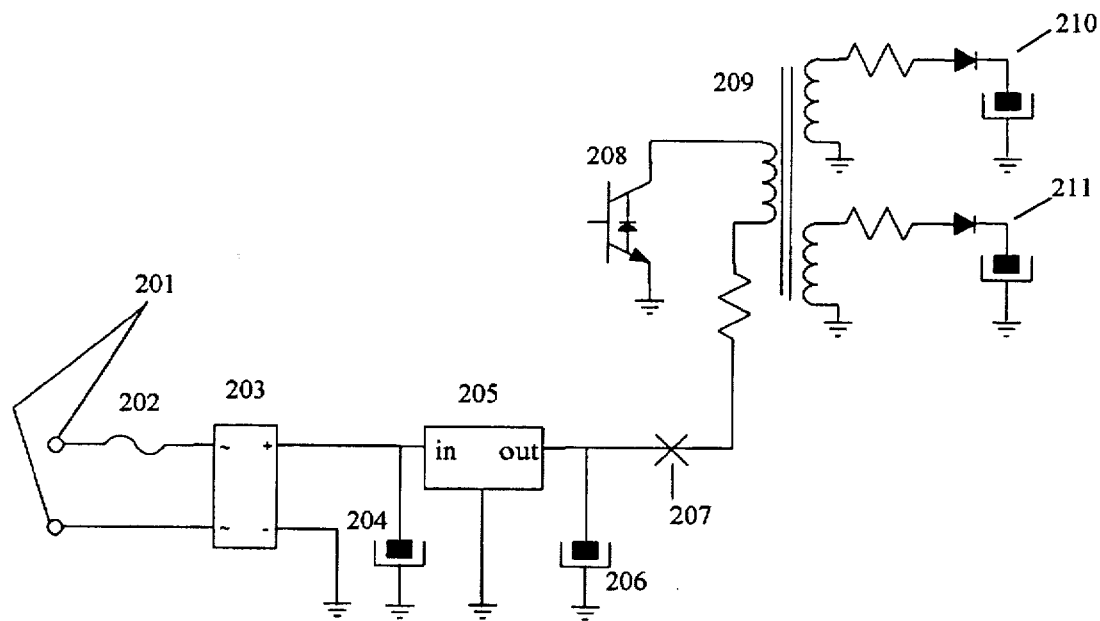
FIG. 2 is a fragment of a horizontal deflection circuit.
Figure 3:
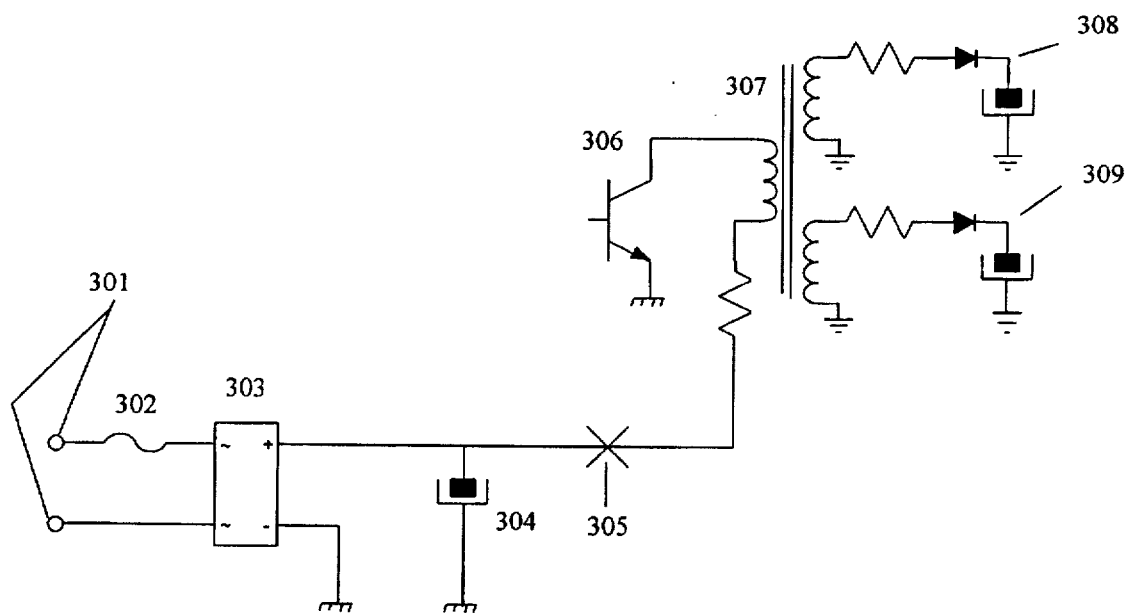
FIG. 3 is a fragment of a switching power supply.

Usually the defective unit has a blown fuse 202 on FIG. 2 and 302 on FIG. 3. The easiest place to connect the leads from the instrument would be across the blown fuse. If the fuse is not blown, remove it and connect the leads from the instrument in its place. This gives good protection. To achieve the best protection, connect the instrument in series with the D.C. line between the filter capacitor and the load, point 207 on FIG. 2 and point 305 on FIG. 3. The instrument is connected so that the current from the main power supply must pass through the instrument to the switching transformer, or flyback transformer. The circuit should be opened at point 207 on FIG. 2 and leads 13 & 21 of FIG. 4 connected to complete the circuit. The circuit should be opened at point 305 on FIG. 3 and leads 13 & 21 of FIG. 4 connected to complete the circuit.

Fig 1

| 10 Diode | 11 Diode | 12 Capacitor | 13 Terminal |
| 14 Transistor | 15 Ammeter | 16 Fuse | 17 Potentiometer |
| 18 Resistor | 19 Diode | 20 Diode | 21 Terminal |
| 22 Capacitor | 23 Resistor | 24 Transistor | 25 Capacitor |
| 26 Resistor | 27 Resistor | 28 Transistor | 29 Resistor |
| 30 Resistor | 31 Transistor | 32 Resistor | 33 Transistor |
| 34 Resistor | 35 Transistor | 36 Resistor | 37 Zener Diode |
| 38 Resistor | 39 Light Emitting Diode | 40 Resistor | 41 Capacitor |

Fig. 2

| 201 A.C. input | 202 Fuse | 203 Rectifier | 204 & 206 Filter Capacitor |
| 205 Voltage Regulator | | 207 Point to connect the instrument | |
| 208 Horizontal Output Transistor | | 209 Flyback Transformer | |
| 210 & 211 Derived Voltages | | | |

Fig. 3

| 301 A.C. input | 302 Fuse | 303 Rectifier | 304 Filter Capacitor |
| 305 Point to connect the instrument | | | 306 Switching Transistor |
| 307 Switching Transformer | | | 308 & 309 Derived Voltage |

FIG. 4

Figure 1:
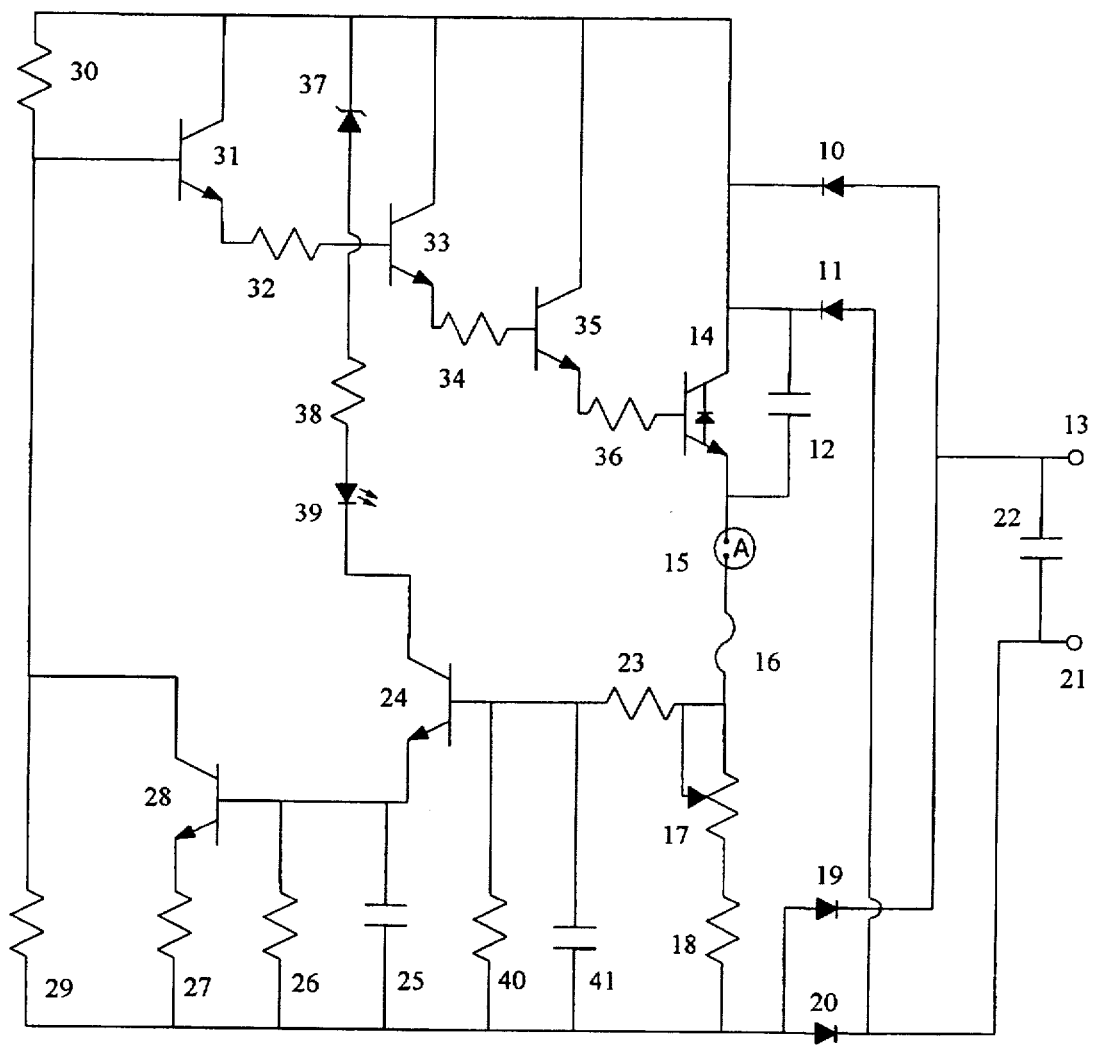
FIG. 1 is the schematic diagram of the instrument.

15 Ammeter also 15 of FIG. 1

13 & 21 Clip leads connected to terminals 13 & 21 of FIG. 1

17 Knob and dial coupled to Potentiometer 17 of FIG. 1

22 Contains capacitor 22 of FIG. 1

DESCRIPTION OF THE PREFERRED EMBODIMENT

Refer to FIG. 1, 2, 3, 4.

Figure 4:
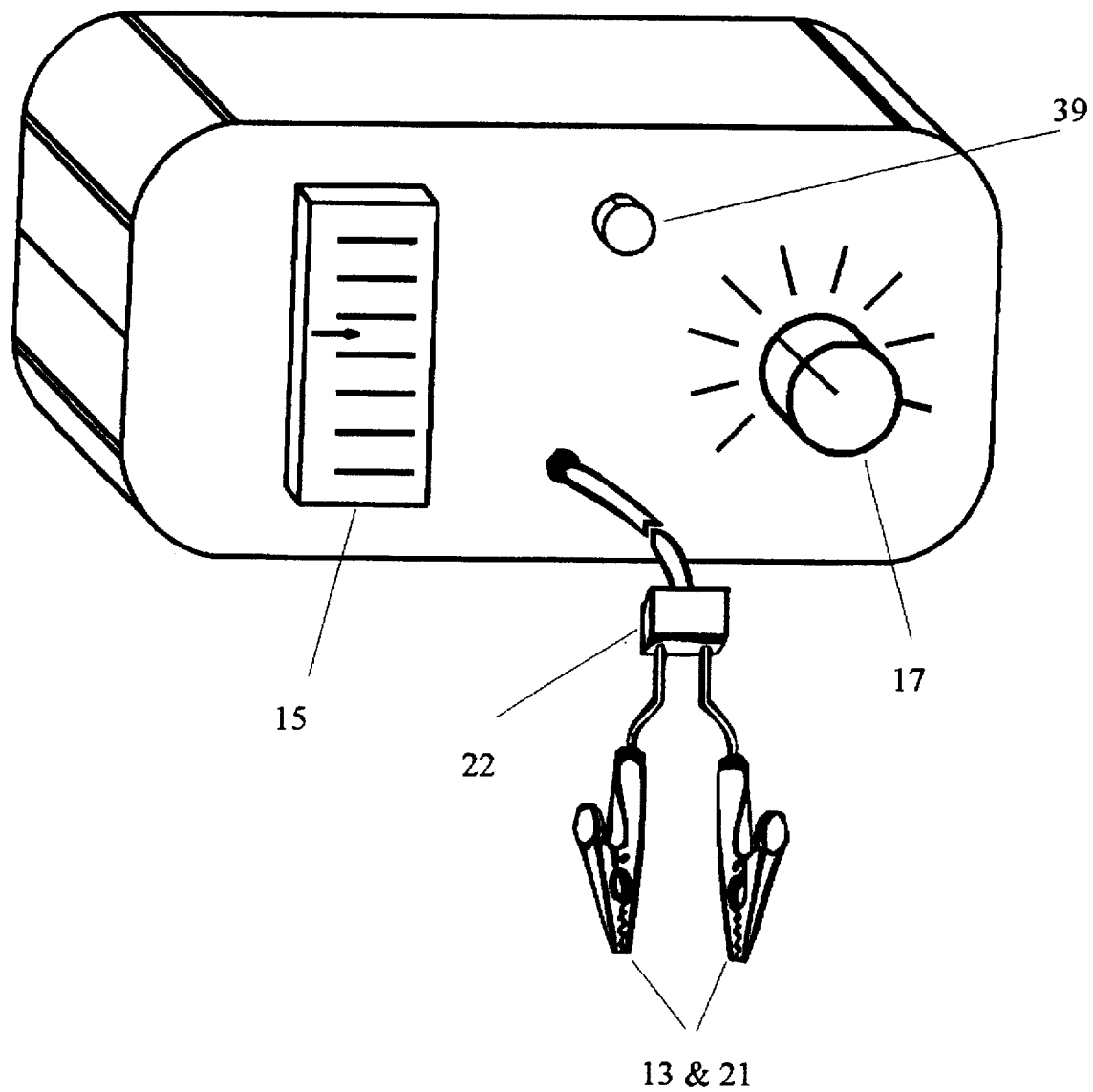
FIG. 4 is the Instrument.

The instrument as shown in FIG. 4 is housed in a container with a front panel that exhibits a current indicator 15, a light emitting diode 39, a knob coupled to potentiometer 17 and two connection leads 13 and 21.

Set the dial to the current expected of a normal functioning unit (typically 0.4 Amperes for a small television to 1.5 Amperes for a large television). Apply power to the unit. If the LED (Light Emitting Diode) lights, this means the unit is shorted.

When the unit is repaired, the LED will not light and by increasing the setting on the dial the ammeter reading will peak, i.e., not increase above that of the normal functioning unit. If the ammeter reading continues to increase and follows the increase in setting of the dial, the short is still present. The present invention will automatically control the current in the faulty equipment as opposed to the passive methods in the prior art. The present invention will adjust its conduction automatically to limit the current to the value that was set on the dial.

This is explained using conventional current flow. The invention operates as follows.

Refer to FIG. 1.

This is an active instrument in that it automatically adjusts its conduction limited to what is set on its dial.

Television horizontal output circuits and switching power supplies when functioning normally draw large pulses of current for short periods. The instrument will allow this normal pulse of current to pass without hindrance; if this current is too much, or lasts too long, the instrument will respond by limiting the current to the value which is set on the dial. To accomplish this, the instrument provides a milder control for slight overloads than for a heavy overload.

Mild control is accomplished when zener diode 37 is not conducting. This puts zero voltage on the collector-emitter of transistor 24. The base-emitter junction of transistor 24 will act as a diode at this time passing current to transistor 28. The time constant of capacitor 41 and resistor 23 also helps in dampening the instruments response.

Aggressive control is accomplished when there is enough voltage dropped to allow zener diode 37 to conduct. At this point (permit this analogy) transistor 24 is armed and ready to fire. This sharp control is needed because when there is such a large voltage drop, the unit under test and the instrument is in imminent danger.

Terminals 13 and 21 are connected in series with the unit being repaired, or in series with the line that is short circuited. Capacitor 12 and 22 bypass spikes, capacitor 25 suppresses oscillation, and capacitor 41 prevents response to normal conduction pulses.

If 13 is more positive than 21, current flows through diode 10, transistor 14, amp meter 15, fuse 16, potentiometer 17, resistor 18, diode 20, to terminal 21. If 21 is more positive than 13, current flows through diode 11, transistor 14, amp meter 15, fuse 16, potentiometer 17, resistor 18, diode 19, to terminal 13.

Resistor 30 conducts turning on transistor 31, thereby turning on transistor 33 through resistor 32, turning on transistor 35 through resistor 34, turning on transistor 14 through resistor 36. If the unit tries to draw more current than what potentiometer 17 is set to deliver, the voltage across potentiometer 17 will increase turning on transistor 28 through resistor 23 and the base emitter junction of transistor 24. Transistor 28 then conducts reducing bias on transistor 31, thereby limiting the current to the value set on the dial. This provides mild control.

If in order for the instrument to limit the current to the value that was set on the dial, the instrument has to create a voltage drop which exceeds the zener voltage of zener diode 37, voltage will be placed on the collector of transistor 24 through resistor 38 and LED 39. Transistor 24 will then conduct giving more current to the base of transistor 28 thereby reducing bias to transistor 31 further reducing current to the unit. This serves to move the instrument out of a dangerous power dissipation condition, while also giving better protection to the unit under test than the prior art. The LED 39 will now be lit and as the current is reduced the voltage across potentiometer 17 is also reduced. This reduces bias to transistor 24 and the whole cycle repeats. This provides aggressive control.

In this way, the instrument automatically adjusts its conduction to prevent the repeat of destruction of the operable components. Simultaneously the instrument is also exercising the unit giving the unit the maximum current it can take limited to what was set on the dial. This keeps the intermittent component on the brink of failure in the hope that the intermittent component will go bad permanently, making it easier to diagnose.

Blowing the Intermittent component permanently without blowing other good components is desirable. When the component is permanently bad, the technician can easily detect the bad component with an ohmmeter, or other passive tests. A bad transformer usually starts smoking or over heats. By exercising the unit this increases the chance of blowing the intermittent component permanently.

If the intermittent part does not fail permanently, the technician will have a live circuit to troubleshoot. The opportunity is now available to measure voltages and determine the cause of the problem. The technician will measure the derived voltages 210 & 211 on FIG. 2 or 308 & 309 on FIG. 3. Depending on the degree of conductance all voltages will be affected. The one most affected will lead to the faulty component.

The manufacture of this instrument requires standard electronic practices that are commonly known to the industry. All components are standard except potentiometer 17 that has an inverse taper to achieve a linear current adjustment.

This instrument can also be inserted in any short circuited line to troubleshoot that particular line safely. The instrument works equally well with steady state direct current circuits also.

The forgoing description of the preferred embodiment of the invention has been presented for the purposes of illustration and description. It is not intended to be exhaustive or to limit the invention to the precise form disclosed. Many modifications and variations are possible in light of the above teaching. It is intended that the scopes of the invention be limited not by this detailed description, but rather by the claims appended hereto.

I claim:

1. An apparatus for detecting a short circuit condition in television horizontal deflection circuits, wherein the apparatus comprises:

leads electrically connected to a television horizontal deflection circuit for receiving a test current from said television horizontal deflection circuit at a time during which said television horizontal deflection circuit is live;

diode circuitry having a plurality of diodes and connected to said leads, for directing said test current from said television horizontal deflection circuit through an ammeter in a predetermined direction regardless of the orientation of the polarity of the leads;

an active circuit having a plurality of electrically conductive active elements connected in series with said ammeter for controlling said test current so that the controlled test current is maintained at a safe level to prevent damage to said apparatus and said television horizontal deflection circuit;

and an indicating means connected in parallel with said ammeter and said active circuit for visually indicating the presence of a short circuit condition.

\* \* \* \* \*